US008143969B2

(12) United States Patent
Das et al.

(10) Patent No.: US 8,143,969 B2
(45) Date of Patent: Mar. 27, 2012

(54) MULTIPLE TAP ATTENUATOR MICROCHIP DEVICE

(75) Inventors: Amit Das, State College, PA (US); Robert J. Hufnagel, Port Matilda, PA (US); Jamie M. Heddens, State College, PA (US)

(73) Assignee: State of the Art, Inc., State College, PA (US)

( * ) Notice: Subject to any disclaimer, the term of this patent is extended or adjusted under 35 U.S.C. 154(b) by 357 days.

(21) Appl. No.: 12/576,926

(22) Filed: Oct. 9, 2009

(65) Prior Publication Data

US 2011/0084784 A1 Apr. 14, 2011

(51) Int. Cl.
*H01P 1/22* (2006.01)
*H03H 7/24* (2006.01)

(52) U.S. Cl. .................................... 333/81 R; 333/81 A

(58) Field of Classification Search ................ 333/81 R, 333/81 A
See application file for complete search history.

(56) References Cited

U.S. PATENT DOCUMENTS

| | | | | |
|---|---|---|---|---|
| 4,010,430 | A * | 3/1977 | Wolfe | 333/81 A |
| 4,272,739 | A * | 6/1981 | Nesses | 333/81 A |
| 4,310,812 | A * | 1/1982 | DeBloois | 333/81 A |
| 4,787,686 | A * | 11/1988 | Tajima et al. | 327/308 |
| 4,912,394 | A * | 3/1990 | Sugimoto et al. | 323/354 |
| 5,039,961 | A * | 8/1991 | Veteran | 333/81 A |
| 6,480,708 | B1 * | 11/2002 | Tanaka et al. | 455/249.1 |
| 7,196,566 | B2 * | 3/2007 | Kaiser, Jr. | 327/308 |
| 7,256,664 | B1 * | 8/2007 | Blacka et al. | 333/81 R |
| 2009/0231068 | A1 * | 9/2009 | Das et al. | 333/81 R |

* cited by examiner

*Primary Examiner* — Barbara Summons
(74) *Attorney, Agent, or Firm* — Dann, Dorfman, Herrell and Skillman, P.C.

(57) ABSTRACT

A multiple tap attenuator microchip device is disclosed. The device includes a substrate having two or more attenuator taps formed on a surface of the substrate. One or more ground contacts are also formed on the substrate surface and operatively connected to the attenuator taps. The attenuator taps each include a resistive network that is configured to provide a level of attenuation of an rf signal applied to the attenuator tap that is different from the attenuation level provided by the other attenuator tap(s).

20 Claims, 5 Drawing Sheets

MULTIPLE TAP ATTENUATOR MICROCHIP DEVICE

BACKGROUND OF THE INVENTION

1. Field of the Invention

The invention relates generally to chip devices for electronic systems that are operational to modify microwave signals. In particular, the invention relates to a device for the attenuation of an input microwave signal to a fixed power level.

2. Description of the Related Art

Fixed-chip attenuators are designed to attenuate a signal to a fixed power level. Attenuators are commonly used in communication and audio devices, which often have strict size requirements. Multiple levels of attenuation typically require multiple separate attenuation devices. Until now, it was not believed to be possible to provide multiple levels of attenuation on a single chip because of interference that adversely affects the quality of signals in closely adjacent attenuators. The need to use separate different devices to accomplish multiple levels of attenuation is an inefficient use of available space in an electronic device. In view of the ever increasing demand for more compactness in large-scale integration (LSI) electronic devices, it would be desirable to have a single microchip device which provides multiple levels of attenuation, but which requires less space than multiple discrete devices. Such a device would allow multiple levels of signal attenuation in a single device. In addition, a switch could be used to allow the user to cycle between various levels of attenuation.

SUMMARY OF THE INVENTION

The problems associated with making a microchip device that provides multiple levels of signal attenuation are overcome to a large degree by a multiple tap attenuator microchip device according to the present invention. A microchip according to the present invention includes a substrate having a surface. A plurality of input contacts is formed on the surface of the substrate and a plurality of output contacts is also formed on the surface of the substrate separate from the input contacts. A plurality of junction pads is formed on the surface of the device separate from the input pads and the output pads to transmit the signal from the input pads to the output pads. A plurality of resistors, each having a preselected specific resistance value, is formed on the substrate, connecting the input pads to the junction pads. A second plurality of resistors, each having a preselected specific resistance value, is formed on the substrate, connecting the junction pads to the output pads. A third plurality of resistors, each having a preselected specific resistance value, is formed on the substrate, connecting the junction pads to one or more grounding planes. The resistance values of the resistors are selected to provide multiple attenuation levels for a signal input to the device.

DETAILED DESCRIPTION

Figure 1:
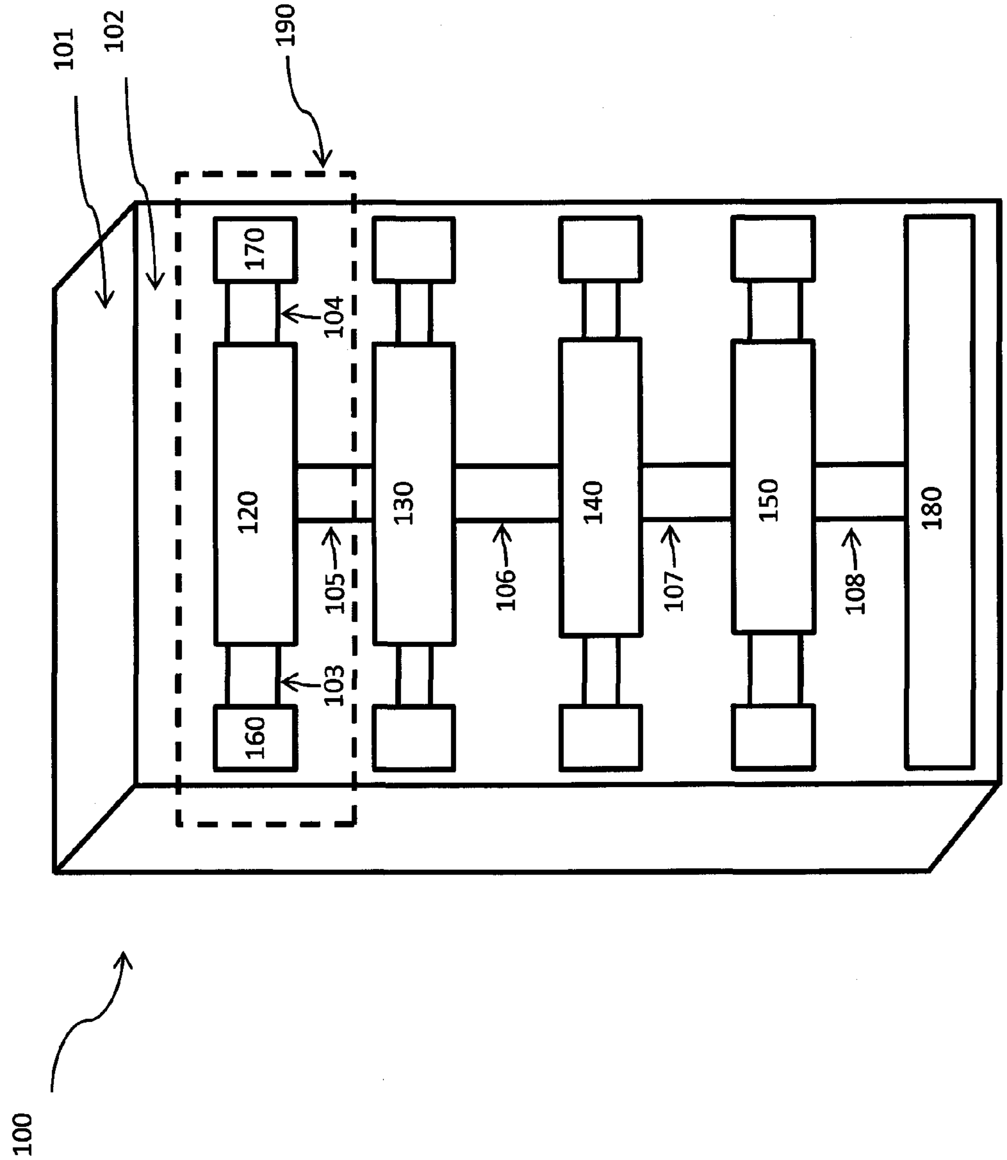
FIG. 1 is a perspective view of a step multi-tap attenuator according to the present invention.

The chip device in accordance with the present invention is a chip package that provides multiple levels of attenuation of a signal input to the device. Referring now to the drawings, and in particular to FIG. 1, there is shown a first embodiment of a chip device according to this invention. Chip device 100 has a substrate 101 that includes a surface 102. The substrate is preferably formed of a ceramic material such as alumina. It will be appreciated by those skilled in the art that the substrate may also be formed of other materials such as aluminum nitride, silica, or beryllium oxide.

A plurality of attenuation taps 190 are formed on the surface of the substrate. A preferred embodiment of a tap 190 will now be described. Attenuation tap 190 includes an input pad 160 formed on the surface 102 of the substrate 101 along a first side thereof. Output pad 170 is formed on the surface 102 of the substrate 101 along another side thereof that is spaced apart from the input pad 160. A junction pad 120 is formed on the surface 102 of the substrate 101 at a location that is spaced apart from input pad 160 and output pad 170. A first resistive element 103 is formed on the surface of the device such that it connects input pad 160 and junction pad 120. A second resistive element 104 is formed on the surface of the substrate such that it connects junction pad 120 and output pad 170. A third or shunt resistive element 105 is formed on the surface of the substrate such that it connects junction pad 120 to junction pad 130 in an adjacent attenuation tap. Resistive elements 103, 104, and 105 are formed to have resistance values to provide a desired level of attenuation of a signal that has been input to input pad 160. A portion of the electrical signal transmitted into the tap 190 is directed to resistor 105, where it is conducted across the junction pads 130-150 via connecting resistors and to grounding plane 180, which is formed on the surface 102 of the substrate 101. Multiple taps of this design are printed on the surface of the device in a spaced-apart configuration, varying only in the resistance levels of resistive elements 103-105. Junction pad 120 is connected to junction pad 130 via resistive element 105. Junction pad 130 is connected to junction pad 140 via resistive element 106. Junction pad 140 is connected to junction pad 150 via resistive element 107, and junction pad 150 is connected to ground plane 180 via resistive element 108. This series of connections between the junction pads 120-150 and ground plane 180 provides a ground path for the signal currents that pass through any of the attenuation taps formed on the device.

The multiple attenuation taps described above provide the device 100 with the capability to perform multiple, different levels of signal attenuation. The plurality of attenuation taps is arranged such that the attenuator with the lowest attenuation value is positioned the farthest away from grounding plate 180. This results from the fact that the attenuator with the lowest attenuation value also has the highest value shunt resistor. The input pads 160, output pads 170, junction pads 120, 130, 140, and 150, and the grounding plane 180 are all formed of a conductive metal such as gold, platinum, or an alloy thereof. The input pads, output pads, junction pads, and the grounding plane may be plated with a nickel and a solder layer deposited thereon. The conductive material is preferably deposited as a thin film, which will be described more fully below. However, the conductive material can be deposited as a thick film in accordance with known thick-film printing techniques. When using thick films, the input pads, output pads, junction pads, and grounding plane may be formed of a silver-platinum alloy, a silver-palladium alloy, or gold. Metal elements made from gold may be coated with a layer of nickel and then a solder material on top of the nickel layer.

Figure 2:
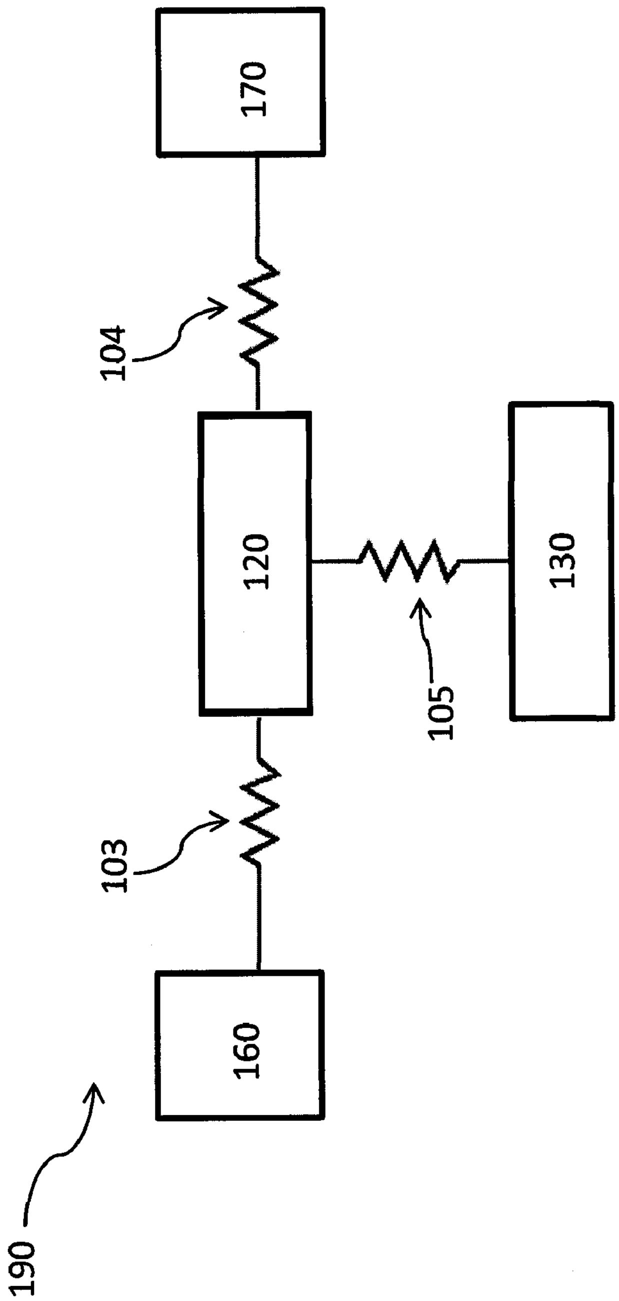
FIG. 2 is a schematic diagram of a typical T-type attenuator circuit used in the multi-tap attenuator of FIG. 1.

FIG. 2 is a schematic diagram of attenuation tap 190. The first resistive element 103 is connected between input contact 160 and junction pad 120. The second resistive element 104 is connected between junction pad 120 and output contact 170. The third resistive element 105 is connected between junction pad 120 and junction pad 130. In this configuration, the three resistive elements 103, 104, and 105 form an attenuator component on the device. The resistive elements 103, 104, and 105 are formed of an electrically resistive material that is preferably deposited as a thin film on the substrate surface. As in the case of the metal contacts, the resistive elements can be formed by using a thick-film technique. The configuration shown in FIGS. 1 and 2 is well known as a T-type attenuator. Alternately, a Π-type attenuator, which is also well known in the art, may be used. The attenuation tap configuration 190 is identical for each tap, and varies only in the resistive values of the resistors 103, 104, and 105 and which connector pads the resistors are connected to.

Figure 3:
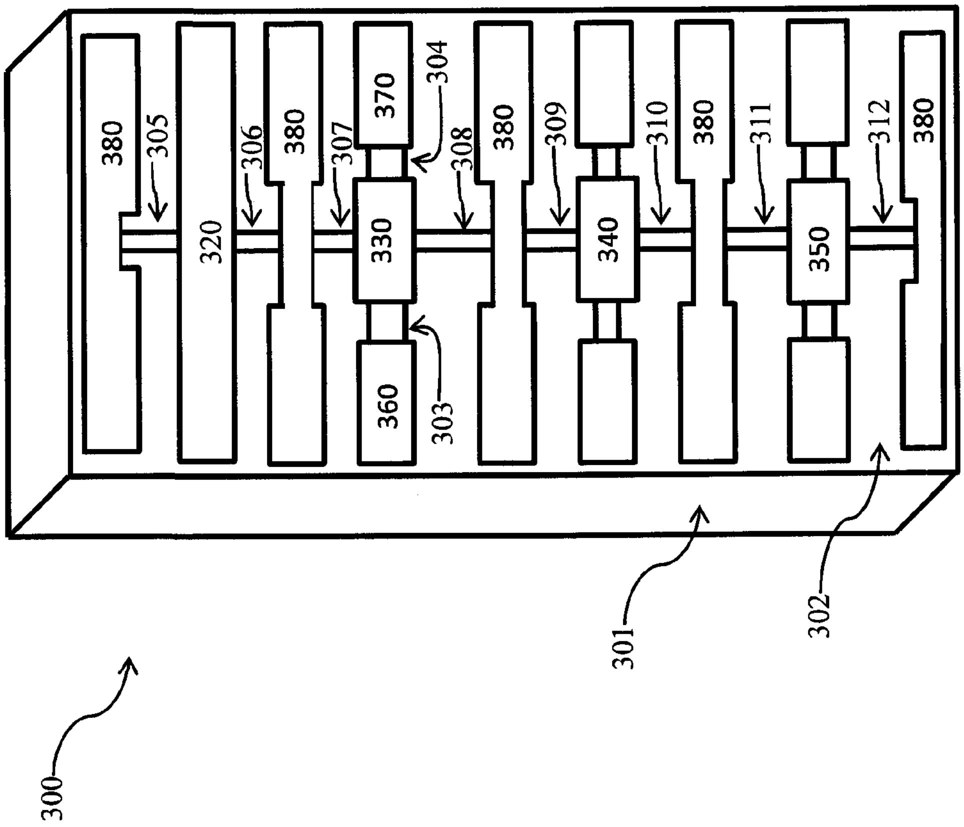
FIG. 3 is a perspective view of a high-frequency multi-tap attenuator according to the present invention.

Referring now to FIG. 3, a second embodiment of the multi-tap attenuator according to this invention is shown. Chip device 300 includes a plurality of grounding planes 380 formed in a spaced-apart configuration on the surface 302 of the substrate 301. The grounding planes 380 are positioned on either side of the signal line, also known as a co-planar attenuator design. A first attenuation tap 320 is formed on the surface 302 of the substrate 301 between first and second grounding planes 380. First attenuation tap 320 consists of a metallic conductive layer and thus, provides minimal attenuation. Resistive elements 305 and 306 connect the first attenuation tap to the grounding planes 380 to provide a grounding path for the current that passes through attenuation tap 320. A plurality of additional attenuation taps are formed on the surface 302 of the substrate 301 between respective pairs of grounding planes 380. For example, a second attenuation tap includes input pad 360 and output pad 370 which are formed on the surface 302 of the substrate 301 in a spaced apart configuration between two of the grounding planes 380. Junction pad 330 is also formed on the surface 302 of the substrate 301 and is spaced apart from input pad 360 and output pad 370. A first resistive element 303 is formed on the surface 302 of the substrate 301 such that it connects input pad 360 to junction pad 330. Resistive element 304 is formed on the surface 302 of the substrate 301 such that it connects junction pad 330 to output pad 370. Resistive elements 307 and 308 are formed on the surface 302 of the substrate 301 such that they connect junction pad 330 with the two immediately adjacent grounding planes 380. Each attenuation tap is formed on the substrate in a similar fashion. The resistance values of resistors 303, 304, 307, and 308 are selected to provide different levels of attenuation to the user in the attenuation taps. The arrangement shown in FIG. 3 is useful to prevent cross-talk interference between attenuation taps in high-frequency signal attenuation because each attenuator tap is isolated from the other taps by the intervening grounding planes. This configuration is different from that shown in FIG. 1 where all of the shunt resistors are tied together to a common ground termination.

Figure 4B:
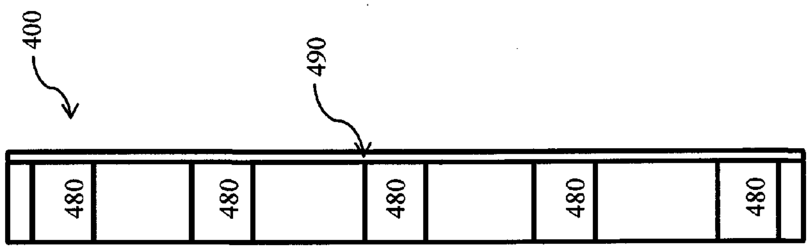
FIG. 4B is a side elevation view of the embodiment shown in FIG. 4A.
Figure 4A:
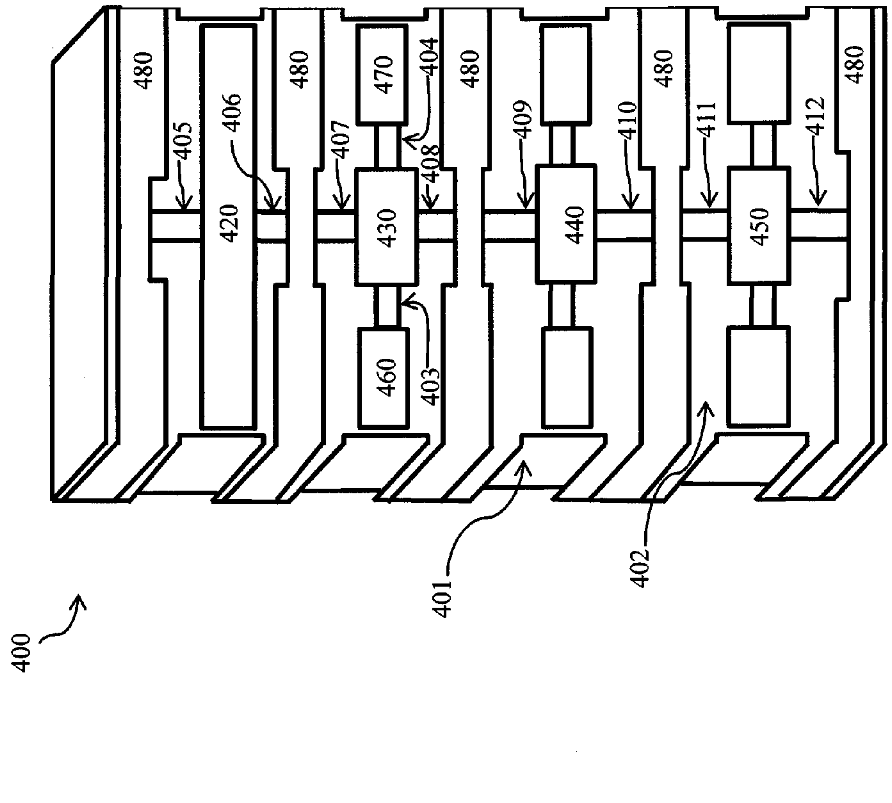
FIG. 4A is a front perspective view of an alternate embodiment of a high-frequency multi-tap attenuator according to the present invention.

Referring now to FIG. 4A, an alternate embodiment of the device of FIG. 3 is shown. Chip device 400 includes a series of grounding planes 480 formed in a spaced-apart configuration on the outer surface 402 of the substrate 401. The attenuation taps are formed on the surface 402 and disposed between pairs of grounding strips 480. In this embodiment, however, the grounding strips 480 wrap around the sides of the substrate and connect to a common ground plane 490 formed on the back surface of the substrate 401 as shown in FIG. 4B. The grounding strips are formed by a metallization process. Notches are formed in the sides of substrate 401 to restrict the metallization process to the areas that require metallization and to prevent metallization in areas that would result in short circuits. The configuration shown and described with reference to FIGS. 4A and 4B permits the device to be inserted into a cavity and have the signal lines leading to the input and output contacts attached with ribbon bonds.

Figure 5:
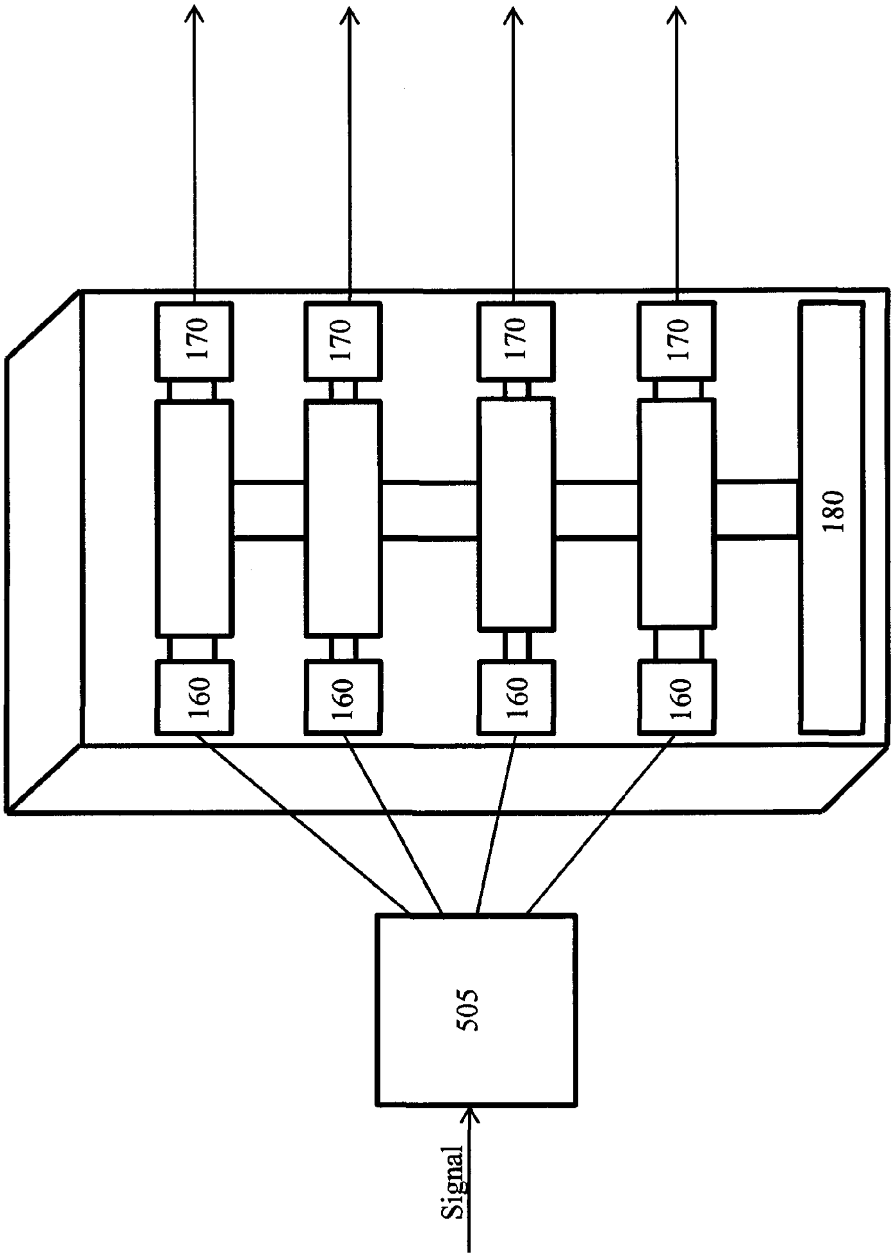
FIG. 5 is a partial schematic diagram of a multi-tap attenuator in combination with a switching system.

FIG. 5 depicts an embodiment of a high-frequency switching system that is designed to allow a user to select among different attenuation levels on the device. A signal is sent from a signal source to high frequency switch 505. The switch 505 can be embodied with any known high-frequency switch devices. Examples of a suitable switch are described in U.S. Pat. No. 6,118,985 owned by Kabushiki Kaisha Toshiba and in U.S. Pat. No. 6,933,543 assigned to the Electronics and Telecommunication Research Institute. Switch 505 routes the signal to one of taps, where it is attenuated and then output in its attenuated form. This creates a complete path for the signal to travel from signal source, through an attenuator, and out of the device, and allows the signal to be selectively attenuated.

A method for making a multi-tap attenuator chip device in accordance with this invention will now be described. The process begins with the selection of an appropriate substrate material. Although the preferred substrate material is alumina, other non-conductive materials can also be used. In this regard, ceramic materials such as aluminum nitride, silica, beryllium oxide, and glass-ceramic composites can be used.

A layer of electrically resistive material is deposited on a surface of the substrate. Next, a plurality of layers of electrically conductive material is deposited over the resistive layer. The resistive and conductive layers are preferably deposited as thin films. The deposition steps are performed in a vacuum. A photo-sensitive material known as a photoresist is spin-coated onto the multiple layers. An etch pattern is formed on the photoresist using ultraviolet (uv) lithography, a known technique. The metallic layers are then etched through the patterned photoresist to form the contacts and conductive paths of the chip device. The photoresist is then stripped away and a new coating of photoresist is applied. The second photoresist coating is patterned, again using uv lithography. The resistive material is then dry etched through the openings in the pattern to form the geometries of the resistive elements for each chip. The dry etching is preferably performed by an ion milling technique. The remaining photoresist is then removed.

The resistive elements are trimmed to final value by any known technique, preferably by laser trimming. Preferably, the chip device is passivated with a polymer to protect it from contamination or physical damage. The substrate is then scored with a laser and separated into individual chip devices.

Although the preferred process has been described as including thin film techniques, the inventors believe that the multi-tap attenuator device according to this invention can be made by thick film printing techniques also. In the case of thick film technology, the substrate is scored or scribed using a laser. Then the conductor patterns are screen printed and sintered onto the substrate surface. Then the resistor patterns are screen printed onto the substrate. A plurality of inks may be used depending on the resistor values desired.

The foregoing descriptions are directed to embodiments of a multi-tap attenuator chip device in accordance with the present invention which can be used alone or as building blocks for more complex devices. Thus, the inventors contemplate that the various embodiments described may be combined as needed to provide desired levels of signal attenuation for a particular application.

The descriptions presented above are also directed to particular embodiments of a multi-tap attenuator chip in accordance with the present invention. It will be recognized by those skilled in the art that changes or modifications may be made to the above-described embodiments without departing from the broad inventive concepts of the invention. It is understood, therefore, that the invention is not limited to the particular embodiments that are described, but is intended to cover all modifications and changes within the scope and spirit of the invention as described above and set forth in the appended claims.

The invention claimed is:

1. A microchip device comprising:

a substrate having a surface;

a first attenuator formed on the surface of said substrate;

a second attenuator formed on the surface of said substrate in spaced relation to said first attenuator; and a grounding contact formed on the surface of said substrate in spaced relation to said first and second attenuators;

said first attenuator comprising a first input contact, a first output contact in spaced relation to said first input contact, and a first resistive network configured to provide a first level of attenuation to an rf signal applied to the first input contact; and said second attenuator comprising a second input contact, a second output contact in spaced relation to said second input contact, and a second resistive network configured to provide a second level of attenuation to an rf signal applied to the second input contact, said second level of attenuation being different from said first level of attenuation;

wherein the first resistive network comprises a first resistor, a second resistor, a first junction pad connected between the first and second resistors, and a first shunt resistor connected between the first junction pad and said grounding contact; and the second resistive network comprises a third resistor, a fourth resistor, a second junction pad connected between the third and fourth resistors, and a second shunt resistor connected between the second junction pad and the first junction pad and to the first shunt resistor through said first junction pad.

2. A microchip device as claimed in claim 1 wherein the resistance values of the first resistor, the second resistor, and the first shunt resistor are selected to provide the first level of attenuation and the resistance values of the third resistor, the fourth resistor, and the first and second shunt resistors are selected to provide the second level of attenuation.

3. A microchip device as claimed in claim 1 comprising:

a third attenuator formed on the surface of said substrate in spaced relation to said first and second attenuators;

said third attenuator comprising a third input contact, a third output contact in spaced relation to said third input contact, and a third resistive network configured to provide a third level of attenuation to an rf signal applied to the third attenuator, said third level of attenuation being different from said first and second levels of attenuation;

wherein the third resistive network comprises a fifth resistor, a sixth resistor, a third junction pad connected between the fifth and sixth resistors, and a third shunt resistor connected between the third junction pad and the second junction pad, and to the first and second shunt resistors through the first and second junction pads.

4. A microchip device as claimed in claim 3 wherein the resistance values of the first resistor, the second resistor, and the first shunt resistor are selected to provide the first level of attenuation, the resistance values of the third resistor, the fourth resistor, and the first and second shunt resistors are selected to provide the second level of attenuation, and the resistance values of the fifth resistor, the sixth resistor, and the first, second, and third shunt resistors are selected to provide the third level of attenuation.

5. A microchip device as claimed in claim 3 comprising:

a fourth attenuator formed on the surface of said substrate in spaced relation to said first, second, and third attenuators;

said fourth attenuator comprising a fourth input contact, a fourth output contact in spaced relation to said fourth input contact, and a fourth resistive network configured to provide a fourth level of attenuation to an rf signal applied to the fourth attenuator, said fourth level of attenuation being different from said first, second, and third levels of attenuation;

wherein the fourth resistive network comprises a seventh resistor, an eighth resistor, a fourth junction pad connected between the seventh and eighth resistors, and a fourth shunt resistor connected between the fourth junction pad and the third junction pad, and to the first, second, and third shunt resistors through the first, second, and third junction pads.

6. A microchip device as claimed in claim 5 wherein the resistance values of the seventh resistor, the eighth resistor, and the first, second, third, and fourth shunt resistors are selected to provide the fourth level of attenuation.

7. A microchip device as claimed in claim 6 comprising a switching device having an input port adapted to receive an rf signal, a first output port operatively connected to said first input contact, a second output port operatively connected to said second input contact, a third output port operatively connected to said third input contact, and a fourth output port operatively connected to said fourth input contact, whereby an rf signal applied to the input port can be switched between the first input contact, the second input contact, the third input contact, and the fourth input contact to be thereby attenuated at either the first, second, third, or fourth level of attenuation.

8. A microchip device as claimed in any of claims 1, 3, and 5 wherein the grounding contact is connected to each of the attenuators and is in spaced relation to each of the input and output contacts.

9. A microchip device comprising:

a substrate having a first surface;

a first attenuator tap formed on the first surface of the substrate;

a second attenuator tap formed on the first surface of the substrate in spaced relation to said first attenuator tap;

a first ground contact formed on the first surface in spaced relation to said first attenuator tap;

a second ground contact formed on the first surface on an opposing side of the first attenuator tap from said first ground contact and spaced from said first and second attenuator taps; and a third ground contact formed on the first surface on an opposing side of the second attenuator tap from said first ground contact and spaced from said second attenuator tap;

wherein said first attenuator tap comprises a first resistive network configured to provide a first level of attenuation of an rf signal applied to said first attenuator tap and said second attenuator tap comprises a second resistive network configured to provide a second level of attenuation of an rf signal applied to said second attenuator tap, said second level of attenuation being different in magnitude from the first level of attenuation.

10. A microchip device as claimed in claim 9 wherein:

the first resistive network comprises:

a first junction pad formed on the surface of said substrate in spaced relation from said first ground contact and said second ground contact;

a first shunt resistor connected between the first junction pad and the first ground contact;

a second shunt resistor connected between the first junction pad and the second ground contact; and the second resistive network comprises:

a first input contact, a first output contact, a second junction pad formed on the surface of said substrate in spaced relation from said first input contact and said first output contact, a first resistor connected between the first input contact and the second junction pad, a second resistor connected between the first output contact and the second junction pad, a third shunt resistor connected between the second junction pad and the second ground contact; and a fourth shunt resistor connected between the second junction pad and the third ground contact.

11. A microchip device as claimed in claim 10 wherein the resistance values of the first shunt resistor and the second shunt resistor are selected to provide the first level of attenuation and the resistance values of the first resistor, the second resistor, the third shunt resistor, and the fourth shunt resistor are selected to provide the second level of attenuation.

12. A microchip device as claimed in claim 9 comprising:

a third attenuator tap formed on the first surface of the substrate in spaced relation to said third ground contact; and a fourth ground contact formed on the first surface on an opposing side of the third attenuator tap from said third ground contact and spaced from said third attenuator tap;

wherein said third attenuator tap comprises a third resistive network configured to provide a third level of attenuation of an rf signal applied to said third attenuator tap, said third level of attenuation being different in magnitude from the first and second levels of attenuation.

13. A microchip device as claimed in claim 12 wherein:

the first resistive network comprises:

a first junction pad formed on the surface of said substrate in spaced relation from said first ground contact and said second ground contact;

a first shunt resistor connected between the first junction pad and the first ground contact;

a second shunt resistor connected between the first junction pad and the second ground contact;

the second resistive network comprises:

a first input contact, a first output contact, a second junction pad formed on the surface of said substrate in spaced relation from said first input contact and said first output contact, a first resistor connected between the first input contact and the second junction pad, a second resistor connected between the first output contact and the second junction pad, a third shunt resistor connected between the second junction pad and the second ground contact; and a fourth shunt resistor connected between the second junction pad and the third ground contact; and the third resistive network comprises:

a second input contact, a second output contact, a third junction pad formed on the surface of said substrate in spaced relation from said second input contact and said second output contact, a third resistor connected between the second input contact and the third junction pad, a fourth resistor connected between the second output contact and the third junction pad, a fifth shunt resistor connected between the third junction pad and the third ground contact; and a sixth shunt resistor connected between the third junction pad and the fourth ground contact.

14. A microchip device as claimed in claim 13 wherein the resistance values of the first shunt resistor and the second shunt resistor are selected to provide the first level of attenuation, the resistance values of the first resistor, the second resistor, the third shunt resistor, and the fourth shunt resistor are selected to provide the second level of attenuation; and the resistance values of the third resistor, the fourth resistor, the fifth shunt resistor, and the sixth shunt resistor are selected to provide the third level of attenuation.

15. A microchip device as claimed in claim 12 comprising:

a fourth attenuator tap formed on the first surface of the substrate in spaced relation to said fourth ground contact;

a fifth ground contact formed on the first surface on an opposing side of the fourth attenuator tap from said fourth ground contact and spaced from said fourth attenuator tap;

wherein said fourth attenuator tap comprises a fourth resistive network configured to provide a fourth level of attenuation of an rf signal applied to said fourth attenuator tap, said fourth level of attenuation being different in magnitude from the first, second, and third levels of attenuation.

16. A microchip device as claimed in claim 15 wherein:

the first resistive network comprises:

a first junction pad formed on the surface of said substrate in spaced relation from said first ground contact and said second ground contact;

a first shunt resistor connected between the first junction pad and the first ground contact;

a second shunt resistor connected between the first junction pad and the second ground contact; and the second resistive network comprises:

a first input contact, a first output contact, a second junction pad formed on the surface of said substrate in spaced relation from said first input contact and said first output contact, a first resistor connected between the first input contact and the second junction pad, a second resistor connected between the first output contact and the second junction pad, a third shunt resistor connected between the second junction pad and the second ground contact; and a fourth shunt resistor connected between the second junction pad and the third ground contact;

the third resistive network comprises:

a second input contact, a second output contact, a third junction pad formed on the surface of said substrate in spaced relation from said second input contact and said second output contact, a third resistor connected between the second input contact and the third junction pad, a fourth resistor connected between the second output contact and the third junction pad, a fifth shunt resistor connected between the third junction pad and the third ground contact; and a sixth shunt resistor connected between the third junction pad and the fourth ground contact; and the fourth resistive network comprises:

a third input contact, a third output contact, a fourth junction pad formed on the surface of said substrate in spaced relation from said third input contact and said third output contact, a fifth resistor connected between the third input contact and the fourth junction pad, a sixth resistor connected between the third output contact and the fourth junction pad, a seventh shunt resistor connected between the fourth junction pad and the fourth ground contact; and an eighth shunt resistor connected between the fourth junction pad and the fifth ground contact.

17. A microchip device as claimed in claim 16 comprising a switching device having an input port adapted to receive an rf signal, a first output port operatively connected to said first attenuator tap, a second output port operatively connected to said second attenuator tap, a third output port operatively connected to said third attenuator tap, and a fourth output port operatively connected to said fourth attenuator tap, whereby an rf signal applied to the input port can be switched between the first attenuator tap, the second attenuator tap, the third attenuator tap, and the fourth attenuator tap to be thereby attenuated at either the first, second, third, or fourth level of attenuation.

18. A microchip device as claimed in claim 9 comprising:

a grounding plane formed on a second surface of said substrate; and a first connector formed on said substrate such that it electrically connects the first ground contact to said grounding plane;

a second connector formed on said substrate such that it electrically connects the second ground contact with said grounding plane; and a third connector formed on said substrate such that it electrically connects the third ground contact with said grounding plane.

19. A microchip device as claimed in claim 18 wherein the first and second surfaces of the substrate are in substantially parallel planes, the substrate has a side surface extending between the first and second surfaces, the first connector comprises a first conductive layer extending from the first ground contact to said grounding plane across said side surface, the second connector comprises a second conductive layer extending from the second ground contact to said grounding plane across said side surface in spaced relation to said first conductive layer, and the third connector comprises a third conductive layer extending from the third ground contact to said grounding plane along said side surface in spaced relation to said second conductive layer.

20. A microchip device as claimed in claim 19 wherein the side surface of the substrate has a plurality of notches formed therein at spaced intervals along the length of the side surface, each of said notches being disposed between adjacent pairs of the first, second, and third conductive layers such that there is substantially no metallization of the substrate side surface in said notches.

* * * * *